United States Patent [19]

Edelman

[11] Patent Number: 5,204,399
[45] Date of Patent: Apr. 20, 1993

[54] THERMOPLASTIC FILM DIE ATTACH ADHESIVES

[75] Inventor: Robert Edelman, Staten Island, N.Y.

[73] Assignee: National Starch and Chemical Investment Holding Corporation, Wilmington, Del.

[21] Appl. No.: 742,981

[22] Filed: Aug. 9, 1991

Related U.S. Application Data

[60] Continuation-in-part of Ser. No. 610,805, Nov. 8, 1990, abandoned, which is a division of Ser. No. 7,321,472, Mar. 9, 1989, Pat. No. 4,994,207.

[51] Int. Cl.$^5$ .................................................. C08K 3/38
[52] U.S. Cl. ................................ 524/404; 524/430; 524/433; 252/500; 252/518; 437/217; 437/220; 439/86; 439/524
[58] Field of Search .................. 524/404, 430, 433; 252/500, 518; 437/217, 220; 439/86, 524

[56] References Cited

U.S. PATENT DOCUMENTS

| | | | |
|---|---|---|---|
| 4,395,527 | 7/1983 | Berger | 528/26 |
| 4,518,735 | 5/1985 | Goodrich et al. | 524/403 |
| 4,652,598 | 3/1987 | Edelman | 524/99 |
| 4,670,325 | 6/1987 | Bakes et al. | 428/209 |
| 4,810,563 | 3/1989 | DeGree | 428/328 |
| 4,869,954 | 9/1989 | Squitieri | 428/783 |
| 4,994,207 | 2/1991 | Edelman et al. | 252/514 |

FOREIGN PATENT DOCUMENTS 0309190  3/1989  European Pat. Off. .

*Primary Examiner*—Paul R. Michl
*Assistant Examiner*—John J. Guarriello
*Attorney, Agent, or Firm*—Jane E. Gennaro; Edwin M. Szala

[57] ABSTRACT

This is a thermally conductive adhesive having excellent die shear strength, in film form, and having a weight average molecular weight of about 100,000 to 150,000, prepared from a mixture of a dietherdianhydride, a meta-substituted benzenediamine, a polysiloanediamine, and a thermally conductive filler, that is suitable as a die attach adhesive: it bonds rapidly without the need for curing or baking off-line; does not produce excess stress on the die; requires no refrigeration; provides uniform bond line thickness between the die and paddle; can be used at temperatures that do not oxidize copper lead frames or produce excessive thermal stress; can be reworked; and can exert adequate adhesion during the processes of wire bonding and molding.

16 Claims, No Drawings

THERMOPLASTIC FILM DIE ATTACH ADHESIVES

This application is a continuation-in-part of application Ser. No. 07/610,805, filed 8 Nov. 1990, now abandoned, which application is a divisional of application Ser. No. 07/321,472, filed 9 Mar. 1989, now 4,994,207.

This invention relates to thermoplastic die attach adhesives that are films and that require short application times for bonding dice to lead frames.

BACKGROUND OF THE INVENTION

Die attach adhesives for use in the microelectronics industry must be capable of being processed quickly and must be thermally or electrically conductive. One group of currently preferred die attach adhesives is the siloxane-modified polyimides. Typically, these are paste-like materials that may or may not contain solvent.

In the fabrication of semiconductor devices, the adhesive is deposited onto the paddle of the lead frame, the die then placed on top of the adhesive and any solvent removed by means of heat. Up to the time of the deposition of the die onto the adhesive, the solvent must be retained by the adhesive paste system for adequate adhesion. After die placement, the solvent must be removed from the adhesive as completely as possible, because if it is retained in the adhesive, it eventually will cause voids when it does evaporate upon exposure to high temperatures. These voids are locales of adhesive failure during thermal cycling. Therefore, removal of the solvent is essential to the performance of the adhesive. Usually, removal is accomplished by baking off-line. This interrupts on-line production and makes the use of adhesive pastes and solutions containing solvent inefficient. In addition, the trend in the industry is toward the increased use of large dice (1"×1" or larger). Because the bulk of the adhesive is covered by the die, which interferes with the escape of solvent, large dice obviously give greater interference in removal of the solvent from the adhesive.

In addition to the problems that are encountered by the presence of solvent in the adhesives, the addition of thermally conductive fillers to adhesives tends to make the adhesive brittle and even more susceptible to mechanical and thermal stress, particularly when used at high loadings.

Thus, there is a need for a die attach adhesive that does not contain solvent or require baking off-line, and that has sufficient flexibility to accept electrically and thermally conductive fillers. A thermoplastic die attach adhesive in film form that bonds rapidly and that can exert adequate adhesion during the processes of wire bonding and molding, and that can be used at temperatures that do not oxidize lead frames or produce excessive thermal stress, would serve this need.

U.S. Pat. No. 4,395,527 issued to Berger discloses that the properties of adhesives can be improved by the incorporation of siloxane and gives a broad general teaching for the syntheses of siloxane-containing polyimide compositions.

U.S. Pat. No. 4,652,598 issued to Edelman discloses the incorporation of polysiloxanes into polyimides to enable the water of imidization, and any solvent used, to be readily removed without producing significant imperfections in the polyimides.

Although, there if a broad general teaching for the syntheses of polyimide compositions in these patents, there is no recognition of the critical combination of reactants required to obtain the specific die attach adhesive properties of the thermoplastic film of this invention.

SUMMARY OF THE INVENTION

The thermally conductive adhesives of this invention are solvent-free films prepared from a mixture of:

(A) a normally solid thermoplastic polyimide polymeric binder having a weight average molecular weight of at least about 100,000 and synthesized from:

(1) an aromatic dietherdianhydride having the structure:

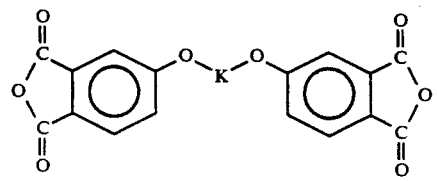

in which K is a substituted or unsubstituted group of the formula:

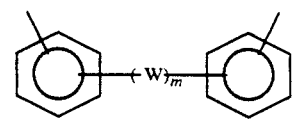

in which W is —O—, —S—, —SO$_2$, linear or branched alkylene or alkenylene having 1 to 8 carbon atoms or —(R)C(L)—, in which R and L can be the same or different lower alkyls having 1 to 8 carbons or aryl groups having 6 to 24 carbon atoms, and m is 0 or 1; and (2) a meta-substituted benzenediamine having the structure:

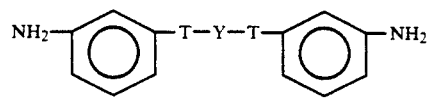

in which Y is a divalent unsubstituted meta-phenylene radical or a meta-phenylene radical substituted with at least one lower alkyl group containing 1 to about 8 carbon atoms; T is selected from the group consisting of —O—, —S—, —SO—, —SO$_2$, —CO— and lower alkylene having 1 to about 6 carbon atoms; the benzenediamine present in an amount of about 20 to about 50 mole percent of the total diamine content of the polyimide polymeric binder; and (3) a polysiloxanediamine having the structure:

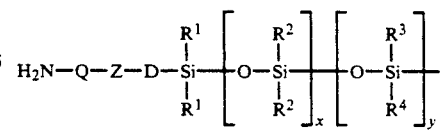

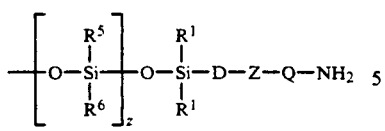

in which Q is arylene; Z is a divalent oxygen, sulfide, sulfone, sulfoxide or carboxylic ester or amide group; D is a hydrocarbylene group; $R^1$, $R^2$, $R^3$, $R^4$, $R^5$ and $R^6$ are the same or different alkyls having 1 to 8 carbons; and x, y and z are integers having values of 0 to 100; the polysiloxane diamine present in an amount of about 80 to about 50 mole percent of the total diamine content of the polyimide polymeric binder; the dianhydride content and total diamine content (inclusive of benzenediamine, polysiloxanediamine, and other organic diamines) present in an unequal molar ratio of diamine to dianhydride of 0.95–0.97:1 or 1.03–1.05:1; and (4) p-aminophenol as an end-capping agent when the dianhydride is in excess, present in an amount up to about 15% of the theoretical equivalents of excess anhydride functionality; or phthalic anhydride as an end-capping agent when the diamine is in excess, present in an amount up to about 15% of the theoretical equivalents of excess amine functionality; and (B) thermally conductive material present in an effective amount to provide a conducting medium.

DETAILED DESCRIPTION OF THE INVENTION

These thermally conductive adhesives are thermoplastic films that are useful for attaching dice to a lead frame paddle rapidly and at a moderate temperature. Because the adhesive compositions are films, the problems with prior art compositions that are pastes containing solvents are avoided. For commercial production purposes, placement of dice into the heated film must occur rapidly (ca. 0.5 second) and with a minimal amount of extra heating time. These films are soft enough so that heating at a temperature of less than 200° C. for a few seconds will allow placement of the dice into the film at a pressure easily obtained using commercial die bonders, and result in adequate adhesion. At temperatures greater than 200° C., oxidation of the copper lead frame will occur, which could alter the performance of the die assembly; therefore, it is critical that these compositions soften at a temperature less than 200° C.

It is also critical that these compositions give adequate adhesion at a temperature about 175° C. After dice placement and cooling of the adhesive bond, the assembly is packaged by molding in a resin at package molding temperatures about 175° C. These films give adequate adhesion of the dice to the lead frame paddle at a temperature of about 175° C. so that the dice remain attached to the paddle during the package molding. Thus, the films are soft enough to achieve rapid die adhesion at a temperature less than 200° C., but strong enough to maintain satisfactory die adhesion at 175° C.

These compositions are also sufficiently flexible even containing large amounts of brittle thermally conductive fillers, up to 75–85 parts by weight of the polyimide, so that excessive stress is not developed on large dice and the position of the dice can be reworded if improper positioning occurs.

These properties were achieved by synthesizing polyimides to a weight average molecular weight range of about 100,000 to about 150,000 from a narrow and critical combination of dietherdianhydrides, meta-substituted benzenediamines, and polysiloxanediamines. The polysiloxanediamines in the composition impart low glass transition temperature domains to the adhesive so that softening can occur rapidly at just below 200° C. These domains must be present in a specific higher modulus matrix that gives sufficient softening at 200° C. but that still has adequate strength at 175° C. This modulus matrix is obtained by the specific combination of dietherdianhydride, meta-substituted diamine and weight average molecular weight range of the composition.

The flexibility of these polyimide composition is obtained by the use of meta-substituted benzenediamines and dietherdianhydrides in their synthesis. The meta-substitution of the benzenediamines and the dietherdianhydrides imparts kinking to the adhesive polymeric chain which reduces the tendency for the polymer chains to pack and form a rigid structure. In addition, the meta-substituted benzenediamines and the dietherdianhydrides utilized in this invention have greater rotation about their ether linkages than para-substituted benzenediamines and non-etherdianhydrides. This rotation imparts a significant and necessary flexiblility to the adhesives that permits the adhesives that permits the adhesive to be made into a film and to absorb the mechanical and thermal stresses that impact on die-attach adhesives. The flexibility also permits the incorporation of a large amount of conductive filler into the adhesives, without resulting in the brittleness normally associated with adhesives packed with fillers.

The dianhydrides suitable for use in these film adhesives are aromatic dietherdianhydrides having the structure;

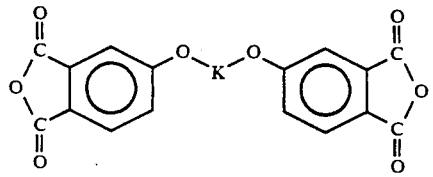

in which K is a substituted or unsubstituted group of the formula:

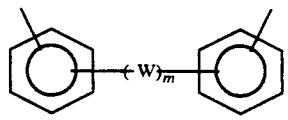

in which W is —O—, —S—, —SO₂, linear or branched alkylene or alkenylene having 1 to 8 carbon atoms or —(R)C(L)—, in which R and L can be the same or different lower alkyls having 1 to 8 carbons or aryl groups having 6 to 24 carbon atoms, and m is 0 or 1.

Representative dianhydrides suitable for use in the adhesives of this invention include:

4,4'-bis(3,4- dicarboxyphenoxy)diphenyl sulfide dianhydride, having the structure:

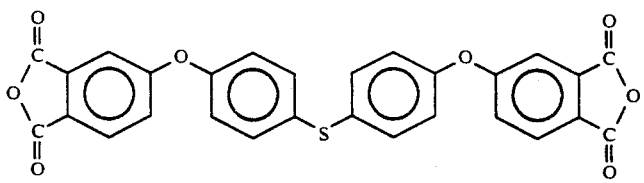

and the corresponding sulfone, 4,4'-bis(3,4- dicarboxyphenoxy)diphenyl sulfone dianhydride.

The benzenediamines suitable for use in these adhesive films are meta-substituted benzenediamines having the structure:

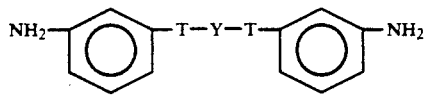

in which Y is a divalent unsubstituted meta-phenylene radical or a meta-phenylene radical substituted with at lease one lower alkyl group containing 1 to about 8 carbon atoms; T is selected from the group consisting of —O—, —S—, —SO—, —$SO_2$, —CO— and lower alkylene having 1 to about 6 carbon atoms. The benzenediamines are present in an amount of about 20 to about 50 mole percent of the total diamine content, inclusive of benzenediamines and polysiloxanediamines, of the adhesive.

Representative meta-substituted benzenediamines suitable for use in the adhesives of this invention include:

bis[1,3(m-aminophenoxy)]benzene;

2,2- bis[3-(m-aminophenoxy)phenyl] propane having the structure:

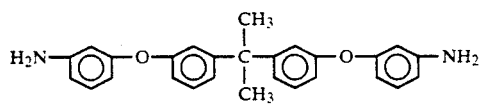

and 2,2-bis[3-(m-aminophenoxy)phenyl] sulfone having the structure:

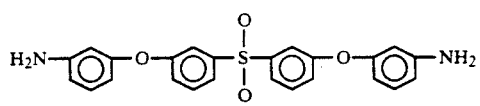

The siloxane-containing diamines suitable for use in this invention are polysiloxanediamines having the structure:

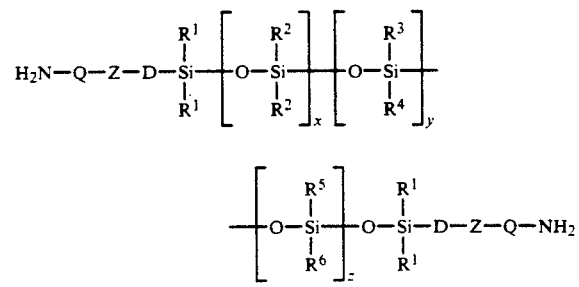

in which Q is arylene; Z is a divalent oxygen, sulfide, sulfone, sulfoxide or carboxylic ester or amide group; D is a hydrocarbylene group; $R^1$, $R^2$, $R^3$, $R^4$, $R^5$ and $R^6$ are the same or different alkyls having 1 to 8 carbons; and x, y and z are integers having values of 0 to 100. The polysiloxanediamines are present in an amount of about 80 to about 50 mole percent of the total diamine content of the binder. The preparation of the polysiloxanediamines used in this invention is well known in the art, see, for example, U.S. Pat. No. 4,395,527, incorporated herein by reference, and also British Pat. No. 1,062,418.

In order to achieve the desired molecular weight, the dianhydride content and total diamine content should be present in the polyimide polymeric binder in an unequal molar ratio of diamine to dianhydride of 0.95–0.97:1 or 1.03–1.05:1. As the practioner will understand, if the molar ratios were equal, the molecular weight of the polymer would be difficult to control and would increase to a higher molecular weight range than desired. By providing a slight excess of either dianhydride or diamine, and by adding an end-capping agent for the unreacted end groups of the excess component, the reaction can be stopped and stabilized at a desired molecular weight. In order to obtain the molecular weight range for the polyimide polymers of this invention, it is critical to restrict the amount of end-capping agent to an amount up to 15% of the theoretical equivalents of unreacted end groups.

Suitable end-capping reagents for anhydride groups are represented by the formula

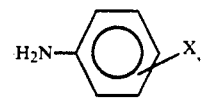

in which X is in a meta or para position to the amine functionality and is H, OH, $C_1$–$C_8$ or OR where R is $C_1$–$C_6$. The preferred end-capping agent for excess anhydride groups is p-aminophenol because it is easy to handle, low in cost, and readily available. All of the excess unreacted anhydride groups are not capable of being capped because water in the reaction mixture reacts with anhydride groups to produce diacid groups. To obtain the molecular weight required for this invention, p-aminophenol as an end-capping reagent generally is added to the polymeric mixture in an amount up to about 15% of the theoretical equivalents of excess anhydride.

Suitable end-capping reagents for amine groups are cyclic mon-functional anhydrides and succinic anhydride. The preferred end-capping agent for excess amine groups is phthalic anhydride because it is easy to handle, low in cost, and readily available. It is added to the polymeric mixture in an amount up to about 15% of the theoretical equivalents of excess amine.

In a preferred embodiment, the dianhydride is 4,4'-bis(3,4-dicarboxyphenoxy)diphenyl sulfide dianhydride, the diamine is bis[1,3(m-aminophenoxy)]benzene, and the polysiloxanediamine is bis(m-aminophenoxybutyl)hexadecamethyloctasiloxane having the structure:

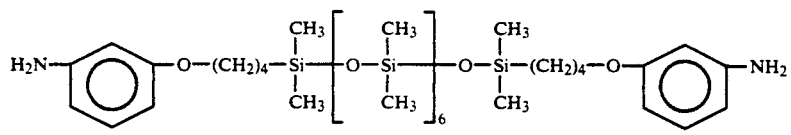

The preferred polyimide composition has a molar ratio of diamine to dianhydride of 0.95–0.97:1 and is derived from a total diamine content of about 25 to 50 mole percent of meta-substituted benzenediamine and about 75 to 50 mole percent of polysiloxanediamine, more preferably from about 30 to 40 mole percent of meta-substituted benzenediamine and about 70 to 60 mole percent of polysiloxanediamine. It is also possible to use a mixture of different organic diamines (not containing siloxane moieties) together with different polysiloxanediamines.

In order to impart thermal conductivity to the adhesive, an effective amount of a thermally conducting material, such as beryllia, boron nitride, aluminum oxide (single crystal) and the like, is added to the adhesive composition. A preferred thermally conducting amount of conductive material ranges from about 75 to about 85 parts per hundred parts by weight of the total film composition, although lesser and greater amounts can be used. The particle size of the conductive material is not narrowly critical.

The invention is further described in the examples which follow. All parts and percentages are by weight unless otherwise specified.

EXAMPLE 1

Preparation of Poly(siloxaneimide)

Into a 12 liter round-bottom flask equipped with a stirrer, thermometer, nitrogen inlet tube, reflux condenser with distillation head attached, modified Dean-Stark moisture trap and heating mantle, were charged 5,969 grams of monochlorobenzene, 49.34 grams (0.1656 mole) of 1,3- bis(m-aminophenoxy)benzene (98% pure) available from National Starch and Chemical Company washed in with 50 grams monochlorobenzene, and 283.5 grams (0.3075 mole) of bis(m-aminophenoxybutyl) hexadecamethyloctasiloxane washed in with 500 grams of monochlorobenzene. The reactants were stirred until solution occurred. Then 0.271 gram (0.00247 mole) of p-aminophenol (99.46% purity from Rhone-Poulenc, Inc.) was added and washed in with 160 grams of monochlorobenzene, followed by 254 grams (0.494 mole, 99.2% purity) of 4,4'-bis(3,4- dicarboxylphenoxy)diphenyl sulfide dianhydride washed in with 600 grams of monochlorobenzene. Then 1.5 grams of p-toluene-sulfonic acid monohydrate were added and washed in with 110 grams of monochlorobenzene. The p-aminophenol is present as a chain stopper and in a minor amount such that its effect on the morphology of the final poly(siloxaneimide) is negligible.

The reaction mixture was heated to reflux in 1–2 hours and 1292 grams of monochlorobenzene were removed by distillation. The reaction mixture was refluxed for 10 hours. After cooling, the solution was filtered and 1860 grams of N-methylpyrrolidone were added and mixed in. The solution was mixed with methanol using 3.5 liters of methanol for every 500 milliliter of solution causing precipitation of poly(siloxane)imide. After precipitation, the methanol was decanted from the precipitate which was washed twice with 8 liters of methanol. The precipitate was air dried overnight and then dried in a circulating air oven at 50°–60° C. until the polymer solids content was >98.5%. The yield was approximately 500 grams. The weight average molecular weight is about 100,000.

EXAMPLE 2

Preparation of Electrically Conductive Polyimide Film Adhesive

The poly(siloxaneimide) prepared in Example 1 was dissolved in diglyme (90° C. for 10 hours) at a 40% solids concentration and filtered. To 116.5 grams of the resultant solution were added 115.5 grams of silver flake GP 0006 (Chemet Corporation) and 17.25 gram of 50-S silver flake (Metz Metallurgical Corporation) and 0.65 gram of Dow Corning 1400 Antifoam. These materials were blended in a planetary mixer for one hour.

A film was prepared by a Doctor blade drawdown (9 mil wet thickness) on glass treated with MS-112 fluorocarbon release agent. The film was air dried overnight and removed from the glass by immersion of the coated glass plate into tap water. The film was then dried at 50° C. in a forced air oven for 6 hours. It was then cut into strips to be used as a film die attach adhesive and was designated Film A. To prepare a thermally conductive film, a thermally conductive material in the same parts by weight is added to the polyimide of Example 1.

EXAMPLE 3

Preparation of Low Molecular Weight Poly(siloxaneimide) Film Binder

Into a 3 liter round-bottom flask equipped with a stirrer, thermometer, nitrogen inlet tube, reflux condenser, 2 distillation columns, modified Dean-Stark moisture trap and heating mantle were changed: 1,269 grams of monochlorobenzene and 71 grams (0.077 mole) of bis(m-aminophenoxybutyl)hexadecamethyloctasiloxane washed in with 120 grams of monochlorobenzene, and 12.45 grams (0.042 mole) of 1,3-bis(m-aminophenoxy)benzene washed in the 100 grams of monochlorobenzene. The reactants were stirred until solution occurred. Then 1.28 grams of p-aminophenol were added and washed in with 100 grams of monochlorobenzene, followed by 63.96 grams (0.124 mole, 99.2% purity) of 4,4'-bis (3,4-dicarboxyphenoxy)diphenyl sulfide dianhydride washed in with 100 grams of monochlorobenzene. Last, 0.365 grams of p-toluene-sulfonic acid monohydrate were added and washed in with 100 grams of monochlorobenzene.

The reaction mixture was heated to reflux in 1–2 hours and 315 grams of monochlorobenzene distilled off. The reaction mixture was refluxed for 10 hours. After cooling, the solution was filtered and 1,889 grams of N-methylpyrrolidone were added with mixing. The solution was precipitated into methanol using 3.5 liters of methanol for every 500 millimeters of solution. After precipitation, the methanol was decanted from the precipitate, and the precipitate washed twice with 8 liters of methanol. The polymer was filtered and washed twice with 2 liters of methanol. It was air dried overnight and dried in a circulating air oven at 50°-60° C. until the polymer solids content was >98.5%. The weight average molecular weight is about 40,000-50,000.

Comparative Examples 4 and 5

A second film die attach adhesive was prepared according to the method of Example 2 from the low molecular weight poly(siloxaneimide) prepared in Example 3, and was designated Film B. A third film die attach adhesive was prepared according to the method of Example 2 from a similar material to that made in Example 1 except that the meta-substituted benzenediamine, 1,3-bis(m-aminophenoxy)benzene, was replaced by an equal number of moles of the para-substituted benzenediamine 2,2-bis[4-(p-aminophenoxy)phenyl]propane, and was designated Film C.

EXAMPLE 6

Evaluation of Film Die Attach Adhesive

Films A, B, and C were each cut into 0.3"×0.3" pieces. A single piece from each was placed on the paddle of a copper lead frame. The film and lead frame were placed on the heater block of a manual die bonder, Model 648-2, manufactured by Kulicke and Soffa Co. of Horsham, Pa., set at 195° C. Immediately, a 250 mil² die was placed on the film under 175 gram pressure for 0.5 second using a die collet heated to 45° C. The heating was then continued for 5 seconds after die placement. No scrubbing was done.

The die shear strengths were measured with a die shear tester, Model M 17503 AJ obtained from Hybrid Machine Products Corp., Canon City, Colo. 81212, at room temperature and at 175° C. The results are shown in Table I.

During the die bonding and testing operations essentially no oxidation of the copper lead frame was detected. It should be noted that some commercially available thermoplastic conductive die attached adhesive films cause extensive oxidation of the lead frame because they require application temperatures of 300° C. or greater.

TABLE I

| Test Temperature | Die Shear Strength | | |
|---|---|---|---|
| | Film A | Film B (low molecular weight) | Film C (p-benzenediamine) |
| 25° C. | 21 kilogram | Die fell off | Die fell off |
| 175° C. | 0.5 kilogram | Die fell off | Die fell off |

The data show that polyimide films prepared with para-substituted benzenediamine, Film C, or prepared to a weight average molecular weight of less than 100,000, Film B, exhibit inferior adhesive characteristics compared to polyimide films prepared with meta-substituted benzenediamines having a weight average molecular weight of greater than 100,000 (Film A).

The preferred embodiments of this invention now being described in detail, various modifications and improvements will become apparent to those skilled in the art. Accordingly, the spirit and scope of the invention are to be limited only by the appended claims and not by the foregoing specification.

I claim:

1. A thermally conducting, thermoplastic melt die-attach adhesive film, which softens at 200° C. but is firm at 175° C. to maintain adhesion, comprising:
   (A) a normally solid thermoplastic polyimide polymeric binder having a weight average molecular weight of about 100,000 to 150,000 and synthesized from:
   (1) an aromatic dietherdianhydride having the structure:

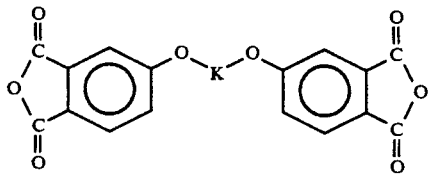

in which K is a substituted or unsubstituted group of the formula:

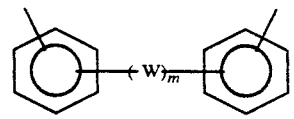

in which W is —O—, —S—, —SO₂, linear or branched alkylene or alkenylene having 1 to 8 carbon atoms or —(R)C(L)—, in which R and L can be the same or different lower alkyls having 1 to 8 carbons or aryl groups having 6 to 24 carbon atoms, and m is 0 or 1; and
   (2) a meta-substituted benzenediamine having the structure:

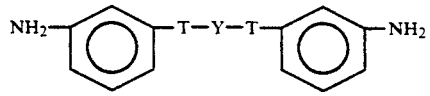

in which Y is a divalent unsubstituted meat-phenylene radical or a meta-phenylene radical substituted with at least one lower alkyl group containing 1 to 8 carbon atoms; T is selected from the group consisting of —O—, —S—, —SO—, —SO₂, —CO— and lower alkylene having 1 to about 6 carbon atoms; the benzenediamine present in an amount of about 20 to about 50 mole percent of the total diamine content of the polyimide polymeric binder; and
   (3) a polysiloxanediamine having the structure:

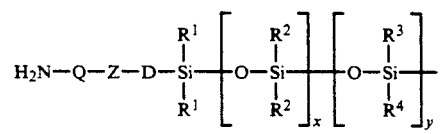

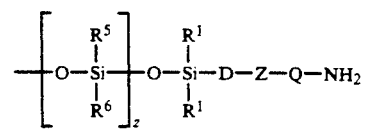

in which Q is a meta-substituted arylene; Z is a divalent oxygen, sulfide, sulfone, sulfoxide or carboxylic ester or amide group; D is a hydrocarbylene group; R¹, R², R³, R⁴, R⁵ and R⁶ are the same or different alkyls having 1 to 8 carbons; and x, y and z are integers having values of 0 to 100; the polysiloxane diamine present in an amount of about 80 to about 50 mole percent of the total diamine content of the polyimide polymeric binder; the dianhydride content and total diamine content present in an unequal molar ratio of diamine to dianhydride of 0.95-0.97:1; and (4) p-aminophenol present as an end-capping agent in an amount up to about 15% of the theoretical equivalents of excess anhydride functionality; and (B) thermally conductive material present in an effective amount up to 85% by weight of the die-attach adhesive film to provide a conducting medium.

2. The film according to claim 1 in which the thermally conductive material is beryllia, boron nitride or single crystal aluminum oxide.

3. The film according to claim 1 in which W is —S—.

4. The film according to claim 1 in which T is —S—.

5. The film according to claim 1 in which T is —O—.

6. The film according to claim 1 in which the dianhydride in the polyimide is 4,4'-bis(3,4- dicarboxyphenoxy)diphenyl sulfide dianhydride.

7. The film according to claim 1 in which the meta-substituted benzenediamine is bis[1,3(m-aminophenoxy)]benzene and the polysiloxanediamine is bis(m-aminophenoxybutyl)hexadecamethyloctasiloxane.

8. The film according to claim 1 in which the polyimide polymeric binder contains about 25 to about 50 mole percent of meta-substituted benzenediamine and about 75 to about 50 mole percent of polysiloxanediamine per total diamine content.

9. A thermally conducting, thermoplastic melt adhesive film comprising:

(A) a normally solid thermoplastic polyimide polymeric binder having a weight average molecular weight of about 100,000 to 150,000, and synthesized from:

(1) an aromatic dietherdianhydride having the structure:

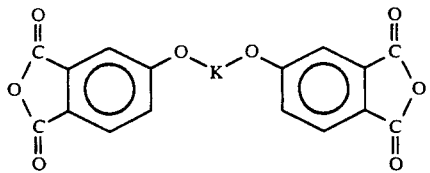

in which K is a substituted or unsubstituted group of the formula:

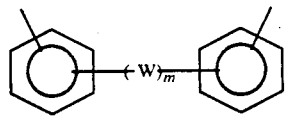

in which W is —O—, —S—, —SO₂, linear or branched alkylene or alkenylene having 1to 8 carbon atoms or —(R)C(L)—, in which R and L can be the same or different lower alkyls having 1 to 8 carbons or aryl groups having 6 to 24 carbon atoms, and m is 0 or 1; and (2) a meta-substituted benzenediamine having the structure:

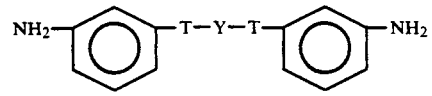

in which Y is a divalent unsubstituted meta-phenylene radical or a meta-phenylene radical substituted with at least one lower alkyl group containing 1 to about 8 carbon atoms; T is selected from the group consisting of —O—, —S—, —SO—, —SO₂, —CO— and lower alkylene having 1 to about 6 carbon atoms; the benzenediamine present in an amount of about 20 to about 50 mole percent of the total diamine content of the polyimide polymeric binder; and (3) a polysiloxanediamine having the structure:

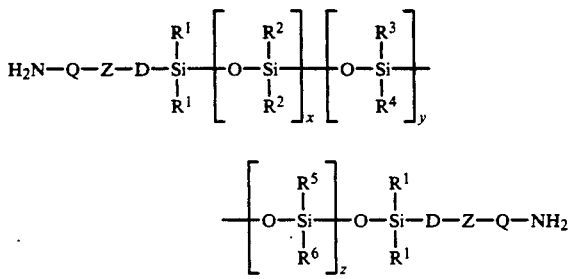

in which Q is arylene; Z is a divalent oxygen, sulfide, sulfone, sulfoxide or carboxylic ester or amide group; D is a hydrocarbylene group; R¹, R², R³, R⁴, R⁵ and R⁶ are the same or different alkyls having 1 to 8 carbons; and x, y and z are integers having values of 0 to 100; the polysiloxane diamine present in an amount of about 80 to about 50 mole percent of the total diamine content of the polyimide polymeric binder; the dianhydride content and total diamine content present in an unequal molar ratio of diamine to dianhydride of 1.03-1.05:1; and (4) phthalic anhydride present as an end-capping agent in an amount up to about 15% of the theoretical equivalents of excess amine functionality; and (B) thermally conductive material present in an effective amount to provide a conducting medium.

10. The film according to claim 9 in which the thermally conductive material is beryllia, boron nitride or single crystal aluminum oxide.

11. The film according to claim 9 in which W is —S—.

12. The film according to claim 9 in which T is —S—.

13. The film according to claim 9 in which T is —O—.

14. The film according to claim 9 in which the dianhydride in the polyimide is 4,4'-bis(3,4- dicarboxyphenoxy)diphenyl sulfide dianhydride.

15. The film according to claim 9 in which the meta-substituted benzenediamine is bis[1,3(m-aminophenoxy)]benzene and the polysiloxanediamine is bis(m-aminophenoxybutyl)hexadecamethyloctasiloxane.

16. The film according to claim 9 in which the polyimide polymeric binder contains about 25 to about 50 mole percent of meta-substituted benzenediamine and about 75 to about 50 mole percent of polysiloxanediamine per total diamine content.

* * * * *